United States Patent [19]
Martin

[11] Patent Number: 5,818,280
[45] Date of Patent: Oct. 6, 1998

[54] METHOD AND APPARATUS WITH PRECONDITIONING FOR SHIFTING THE VOLTAGE LEVEL OF A SIGNAL

[75] Inventor: Douglas Ele Martin, Round Rock, Tex.

[73] Assignee: International Business Machines Corporation, Armonk, N.Y.

[21] Appl. No.: 570,042

[22] Filed: Dec. 11, 1995

[51] Int. Cl.[6] .................................................. H03K 17/04
[52] U.S. Cl. ......................... 327/374; 327/376; 327/377; 326/17; 326/80
[58] Field of Search .................................... 327/374, 376, 327/377; 326/17, 62, 63, 75, 80

[56] References Cited

U.S. PATENT DOCUMENTS

| | | | |
|---|---|---|---|
| 4,450,371 | 5/1984 | Bismarck | .................................. 326/80 |
| 4,488,066 | 12/1984 | Shoji . | |
| 4,656,373 | 4/1987 | Plus . | |
| 4,689,505 | 8/1987 | Ghoshal . | |
| 4,703,199 | 10/1987 | Ely . | |
| 4,816,706 | 3/1989 | Dhong et al. . | |
| 4,893,033 | 1/1990 | Itano et al. . | |
| 5,019,728 | 5/1991 | Sanwo et al. . | |
| 5,140,196 | 8/1992 | Shepherd . | |
| 5,151,619 | 9/1992 | Austin et al. . | |
| 5,172,016 | 12/1992 | Dobberpuhl . | |
| 5,216,299 | 6/1993 | Wanlass | ................................... 307/475 |
| 5,223,751 | 6/1993 | Simmons et al. | ........................ 307/475 |
| 5,231,318 | 7/1993 | Reddy . | |
| 5,406,142 | 4/1995 | Nakama et al. . | |
| 5,410,267 | 4/1995 | Haycock et al. . | |
| 5,455,526 | 10/1995 | Runas . | |
| 5,502,406 | 3/1996 | Traynor et al. | ............................ 326/68 |

*Primary Examiner*—Timothy P. Callahan
*Assistant Examiner*—Jung Ho Kim
*Attorney, Agent, or Firm*—Anthony V. S. England

[57] ABSTRACT

A shifter receives a multi-logic state input signal and generates a multi-logic state output signal responsive to switches in logic state of the input signal and whose voltage level is shifted with respect to the input signal. A feedback circuit feeds a signal derived from the output signal back to the shifter to precondition the shifter so that the speed of the output signal switching is accelerated.

4 Claims, 5 Drawing Sheets

METHOD AND APPARATUS WITH PRECONDITIONING FOR SHIFTING THE VOLTAGE LEVEL OF A SIGNAL

CROSS REFERENCE TO RELATED PATENT APPLICATIONS

Method and Apparatus with Active Feedback for Shifting the Voltage Level of a Signal, U.S. patent application Ser. No. 08/570,043.

FIELD OF THE INVENTION

This invention relates generally to drivers in information processing systems, and more specifically may apply to drivers for interfacing circuits having different voltage requirements, such as circuits fabricated by different CMOS technologies.

BACKGROUND OF THE INVENTION AND PRIOR ART

The internal voltage supply of an integrated circuit and the corresponding voltage level of signals which can be handled by the circuit are influenced by the requirements and limitations of fabrication technology used for the circuit. It is not unusual for a computer system to have integrated circuits which are fabricated using somewhat different technologies requiring different internal voltage supplies. These circuits within the system must; nevertheless communicate with one another. For example, a microprocessor integrated circuit may be fabricated using a certain CMOS technology which requires a nominal 2.5 volt internal voltage supply (Vdd), while other devices which communicate with the microprocessor on the computer system interface bus or memory bus are fabricated using a somewhat different CMOS technology requiring a nominal 3.6 volt internal voltage supply (OVdd). The devices having the OVdd internal voltage supply may require an logic high signal, such as one inputted from the microprocessor, to approach OVdd, while the microprocessor can only supply a high level signal approaching Vdd. Also, if OVdd exceeds certain maximum source-to-drain or gate oxide breakdown voltages for FET's in a device, the device may require that a logic low signal, such as one inputted from the microprocessor, be limited to some voltage sufficiently above ground to prevent damage.

It is known by persons of reasonable skill in the art to use a half latch circuit as shown in FIG. 1 to shift the voltage level. of a signal. The circuit has a first stage, drain-source coupled pair of FET's, P1 and N1, and a second stage, drain-source coupled pair of FET's, P2 and N2, with the PFET's supplied by a certain voltage Vhh. Coupled to the gate of FET N1 is an input signal with a high logical state at a voltage below that of Vhh and a low logical state at a still lower voltage level. The output of the first stage, is coupled to the gate of FET N2. The output of the second stage provides the half latch circuit output signal, and is also coupled back to the gate of FET P1.

The operation of the half latch circuit of FIG. 1 may be understood as follows. A high input signal turns on N1, pulling down the first stage output and turning on P2. The high input signal is complemented by the inverter and the resulting low inverter output signal turns off N2. With P2 on and N2 off, this pulls up the second stage output signal to a voltage level approaching Vhh. The high output signal is also fed back to the gate of PFET P1, turning off P1 so that P1 does not oppose the pulling down of the first stage output by N1.

A low input signal turns off N1, which does not affect the output of the first stage. The low input signal is also complemented by the inverter. The resulting high inverter output signal turns on N2, which tends to pull down the second stage output. However, a contention exists at this point because P2 remains on, tending to pull up the second stage output. In order to resolve this contention it is typical to select NFET N2 of a size capable of overdriving PFET P2 so that the output of stage 2 is pulled down when both N2 and P2 are on. The contention is further resolved when the low output signal is fed back to the gate of P1, turning on P1, pulling up the output of stage 1, and turning off P2.

For a falling input signal, this contention between P2 and N2 in the prior art half latch circuit slows down transition of the output signal from the high to low logic states. It also increases power requirements.

A need therefore exists for an improved voltage level shifter ("shifter") to couple different circuits together and shift the voltage level of signals sent from one circuit to the other. Ideally such a voltage shifter circuit would reduce the time delay in output response to a change in input signal and would reduce power consumption.

SUMMARY OF THE INVENTION

An objective of the invention is to shift the voltage level of signals sent from one circuit to another.

According to the present invention, the foregoing and other objects are attained by a shifter receiving an multi-logic state input signal having certain voltage levels for the logic states. The input signal may be generated by circuitry which operates within certain voltage requirements. In response to the state of the input signal the shifter generates at least one output signal having a logic state that follows the input signal, but shifted to a different voltage level so that the shifted signal can be used to drive a circuit requiring different operating voltage levels than the circuit generating the input signal.

A feedback circuit receives the shifter output signals and generates at least one multi-logic state feedback signal responsive to the received signals. The feedback signals are coupled to the shifter. When the input signal changes logic states, driving the shifter output signals to also change states, the feedback signals change state, causing the shifter to "precondition" in anticipation of a succeeding change in shifter input signal. The preconditioning establishes a condition in the shifter so that when the input signal to the shifter changes state again, the shifted output signal of the shifter changes states faster than the signal would have without the preconditioning.

The invention further contemplates that the preconditioning switches at least one switching device to a physical state that is advantageous for a succeeding logic state of the shifter output signal so that when the input signal changes to the succeeding logic state the switching device has already switched to the physical advantageous state.

The invention further contemplates that for a bi-state implementation of the embodiment described further herein, the shifter has a first voltage supply compatible with the voltage requirements of the circuit which generates the input signal to the shifter, and a second voltage supply at a higher voltage level compatible to the voltage requirements for the circuit which is driven by the shifter. Certain switching devices in the shifter are supplied off the first voltage supply and certain switching devices in the shifter are supplied off the second voltage supply. During preconditioning at least one of the higher voltage switching devices is driven toward an off state so that when an output signal transitions to a logic low state the switching device does not oppose the transition.

An advantage of the present invention is a reduction in the inherent time delay introduced by shifting the voltage level of signals sent from one circuit to another.

Another advantage is a reduction in power required for shifting the voltage level of signals sent from one circuit to another.

Additional objects, advantages, and novel features are set forth in the following description, or will be apparent to those skilled in the art or those practicing the invention. Other embodiments are within the spirit and scope of the invention. These objects and embodiments may be achieved by the combinations pointed out in the appended claims. The invention is intended to be limited only as defined in the claims.

DESCRIPTION OF THE PREFERRED EMBODIMENT

Figure 1:
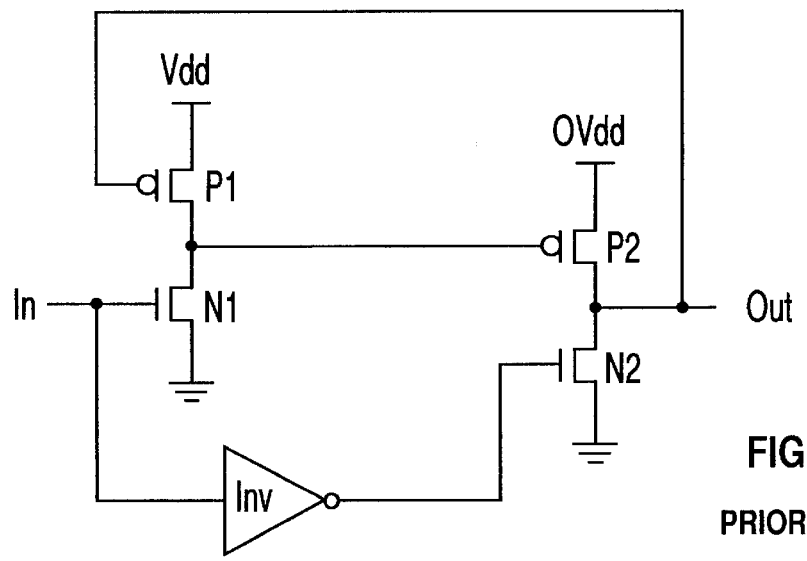
FIG. 1 is a schematic diagram of a prior art half latch circuit.
Figure 2:
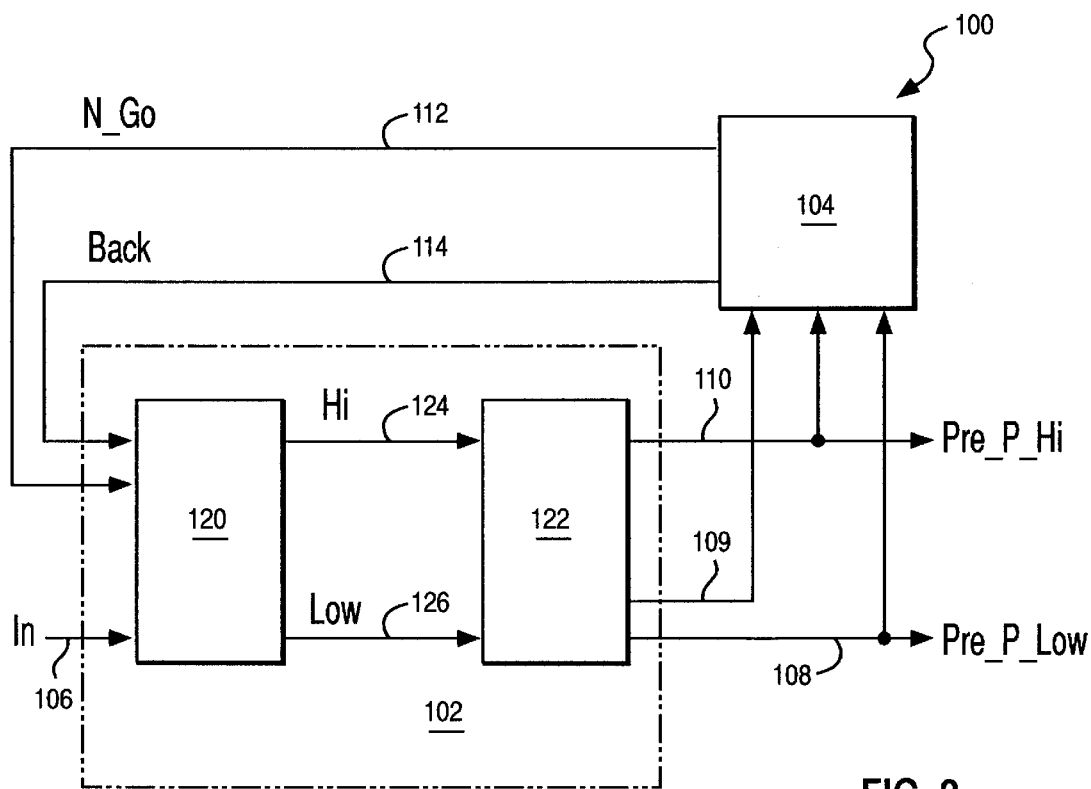
FIG. 2 is a block diagram of a device embodying the invention, showing the interconnected shifter and feedback elements.

A driver 100 embodying the present invention is shown in FIG. 2. The driver includes a shifter stage 102 and a feedback stage 104. Shifter 102 is coupled to a multi-logic state input signal. over line 106. The input signal has certain voltage levels for the logic states. The voltage levels for the logic states of the feedback signals may be essentially the same as the voltage levels for the logic states of the shifter 102 output signals. In response to the state of the input signal, the shifter 102 generates a first and second output signal having logic states corresponding to the input signal, but one of the output signals is shifted to a different voltage level so that the shifted signal can be used to drive a circuit requiring different voltage levels than a circuit generating the input signal to the shifter. The shifter 102 operates in a static mode, i.e., holding an output state for an indefinite time as long as the input state is held.

The feedback circuit 104 is coupled to the shifter 102 output signals by lines 108 through 110. In response to the shifter 102 output signals the feedback stage 104 generates a first and second multi-logic state feedback signal responsive to the received signals. The feedback signals are coupled to the shifter 102 over lines 112 and 114. The voltage levels for the logic states of the feedback signals are essentially the same as the voltage levels for the logic states of the shifter output signals.

The signals have high and low logic states. For a first set of signals, Hi, Pre_P_Hi and Back, a high logic state has a voltage level of about OVdd and a low logic level of about Vlim, which in the preferred embodiment is set at about 1.2 volts to avoid exceeding breakdown voltage limits. For a second set of signals, In, Pre_P_Low, N_Pre_P_Low, and Back, a high logic state has a voltage level of about Vdd and a low logic level of about ground.

The shifter 102 has a first shifter stage 120 and a second stage 122. The first stage 120 is coupled by the input line 106 to an external device (not shown) which generates the input signal, In. The first stage 120 output signals Hi and Low are coupled to second stage 122 by output lines 124 and 126. The second stage 122 output signals Pre_P_Hi, Pre_P_Low and N_Pre_P_Low are coupled to the feedback stage 104 and externally by output lines 108 through 110. The feedback stage 104 output signals "Back" and "N_Go" are coupled to the first stage 120 of shifter 102 by lines 112 and 114.

Figure 3:
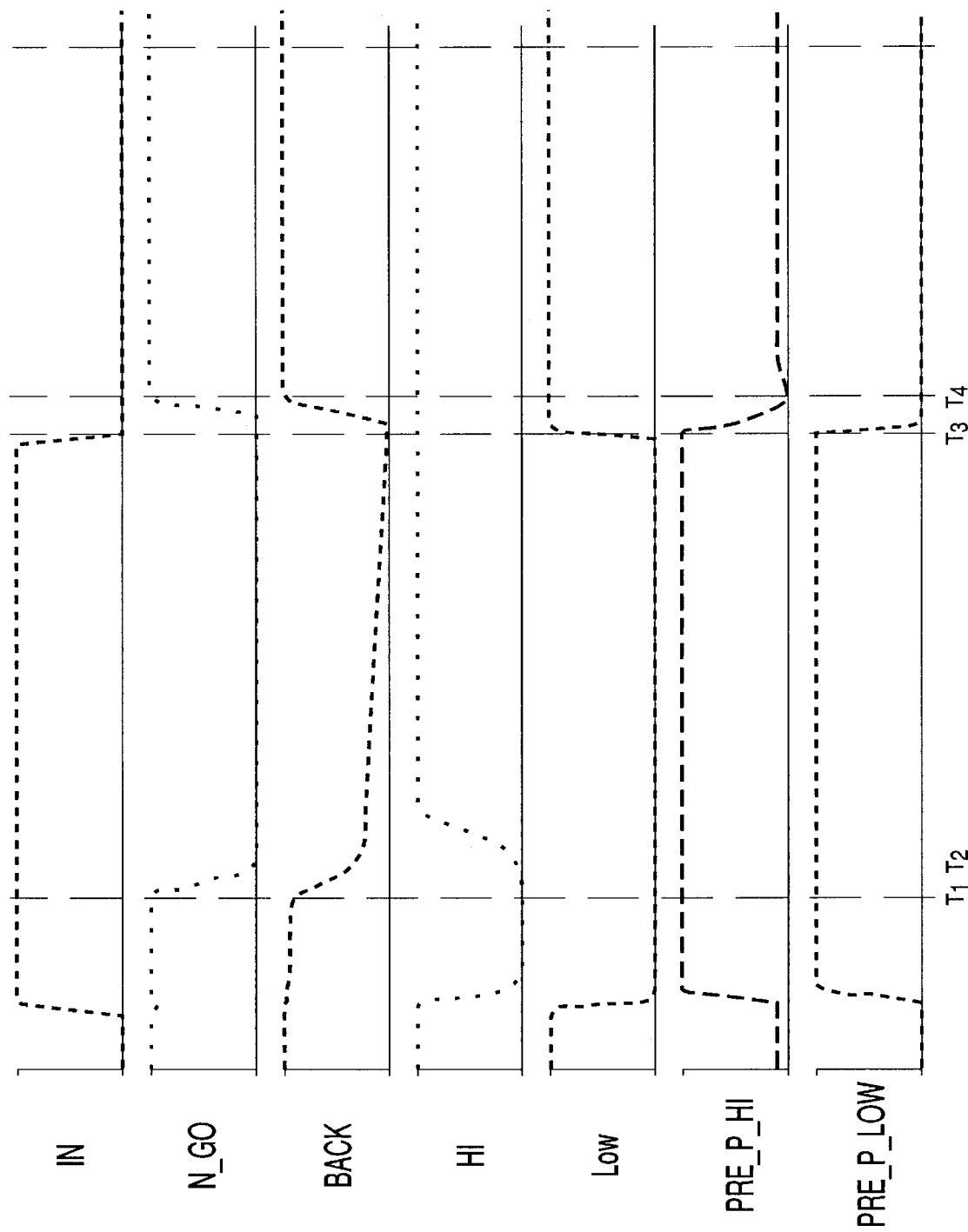
FIG. 3 illustrates the timing of various signals relating to the device.

FIG. 3 shows the response of various shifter 102 and feedback, circuit 104 signals to the In signal. The signals shown are not necessarily to scale. As an arbitrary beginning point for a cycle of the In signal and the resultant responses of the driver 100, consider that the beginning of a cycle is just before the In signal transitions to the high state.

Prior to the transition of the In signal, the N_Go and Back signals from the Feedback stage were already high and the first stage 120 output signals Hi and Low were already high. Also, the second stage 122 output signals Pre_P_Hi and Pre_P_Low were low.

Upon the In signal going high, the first stage 120 output signals Hi and Low are driven low, the second stage 122 output signals Pre_P_Hi and Pre_P_Low are driven high. (Signal N_Pre_P_Low is the compliment of Pre_P_Low so that the state of N_Pre_P_Low will be understood throughout without explicit mention.) Thus, at time T1 with the signals Back and N_Go from the feedback stage and the In signal all hiqh, the first stage 120 output signals are low, the second stage 122 output signals are high, but the feedback stage 104 output signals Back and N_Go have not yet responded to the change in feedback stage 104 input signals Pre_P_Hi and Pre_P_Low.

Upon the feedback stage 104 responding to the change in the input signals Pre_P_Hi and Pre_P_Low, at time T2 the output signals Back and N_Go go low. In response the shifter 102 first stage 120 drives the Hi signal high but does not drive the Low signal high. The Hi signal going high preconditions the second stage 122, but does not cause the output signals Pre_P_Hi and Pre_P_Low to change states, and does not affect the feedback stage 104.

Upon the In signal going low, at time T3 the Low signal goes high. The Low signal going high drives the second stage 104 output signals Pre_P_Low and Pre_P_Hi low. Because the second stage 104 has been preconditioned by the Hi signal, when the Low signal transitions to the high state the second stage 104 output signals switch to the low state more quickly than they would otherwise.

After time T3, upon the feedback stage 104 responding to the change in the shifter 102 second stage 122 output signals, at time T4 the feedback stage 104 output signals Back and N_Go go high. This preconditions the shifter 102 first stage 120, but does not affect the shifter 102 first stage 120 output signals because when the Back and N_Go signals are high the shifter 102 first stage 120 drives its outputs in response to the In signal. Therefore, Back and N_Go going high do not affect the second stage 122 or feedback stage 104 signals. The preconditioning of the shifter first stage 120 enables the shifter outputs Hi and Low to fall more quickly in response to the In signal going high than they would have otherwise.

This completes a cycle of the In signal and the resultant response of the device 100.

Figure 4:
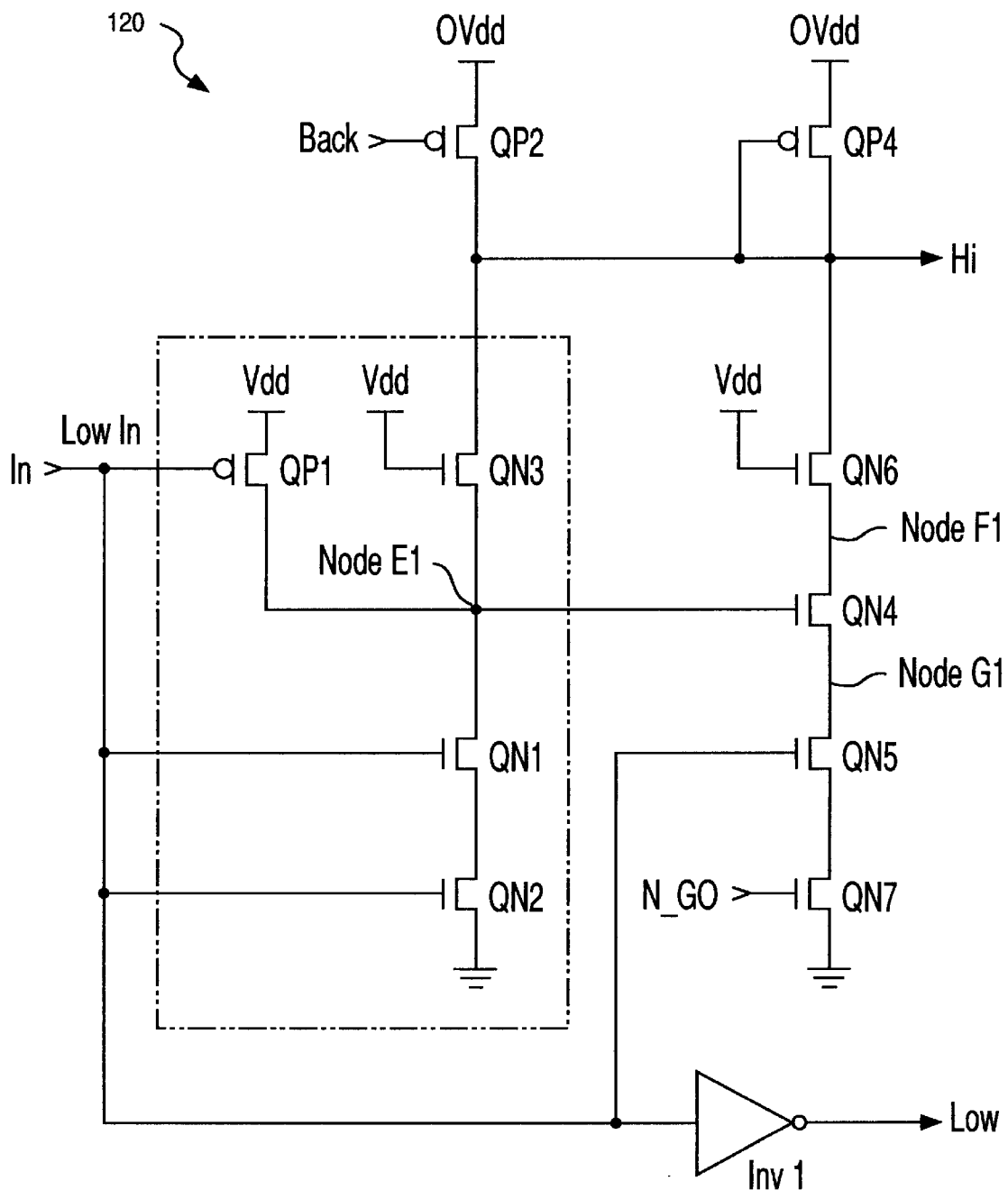
FIG. 4 is a schematic diagram of the first stage of the shifter circuit.

Referring now to FIG. 4, a schematic diagram is shown of a circuit which has been employed for the first stage 120 of shifter 102. The embodiment uses complimentary metal oxide semiconductor field effect transistors ("CMOS FET's") for the switching devices. N-type channel FET's are referred to herein as "QN1", "QN2", etc. P-type channel FET's are referred to as "QP1", "QP2", etc.

At time T1 as referred to above, QP2 is turned off by the high level Back signal at the High input connected to the QP2 gate. QP1 is turned off and QN1, QN2 and QN5 are turned on by the high level In signal at the Low input connected to their gates. The Low signal at the Low output is low due to the high level In signal at the input of inverter Inv 1. QN7 is turned on by the high level N_Go signal at its gate. QN3 and QN6 are generally held on, as long as their source voltages are greater than a threshold voltage below Vdd, since their gates are tied directly to Vdd. The Hi signal at the output is pulled down through QN4, QN5, QN6 and QN7 to a certain voltage, Vlim, by QN1, QN2, and QN3 acting as a voltage divider providing feedback from the QN4 source voltage to the QN4 gate.

Figure 5:
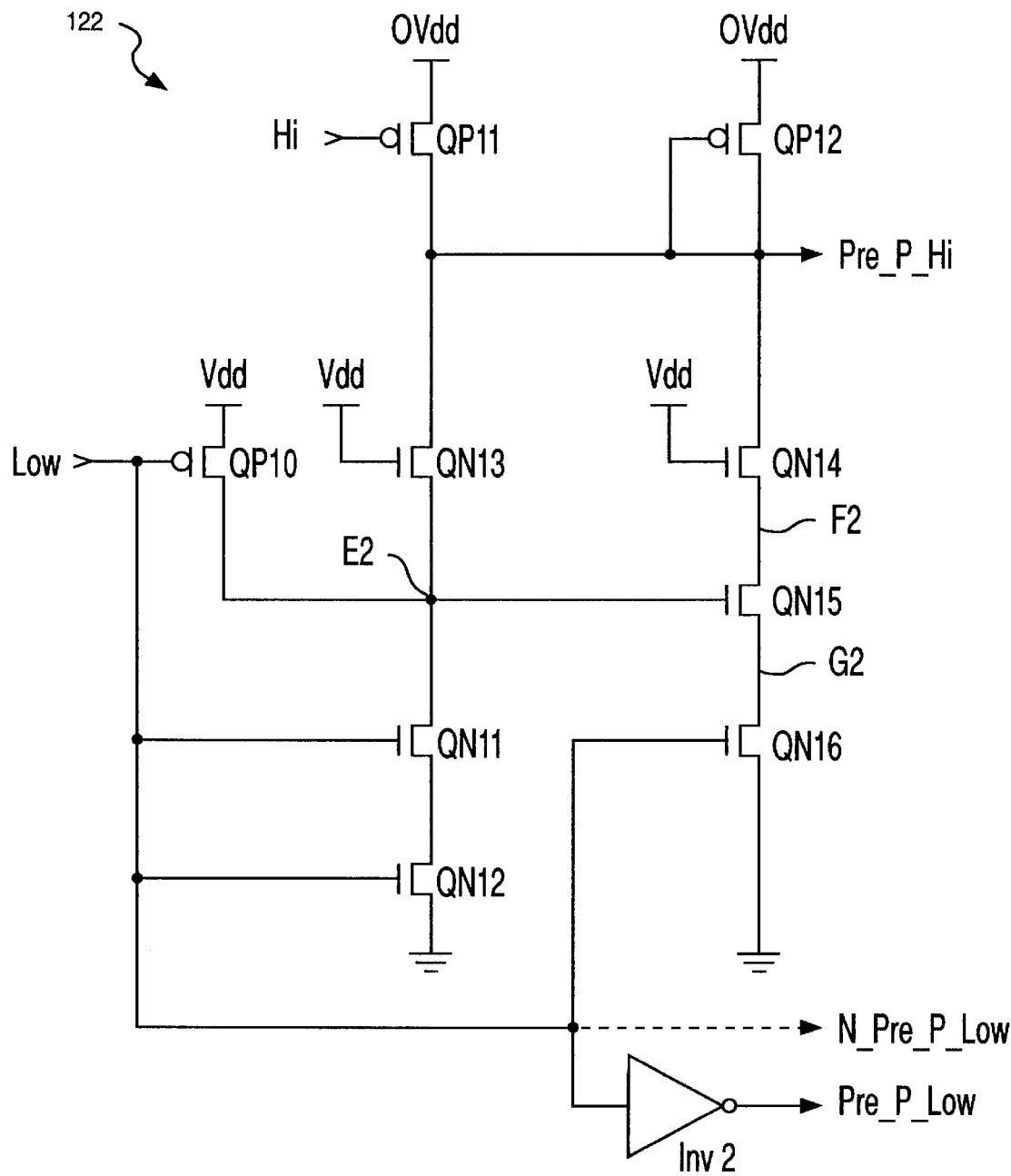
FIG. 5 is a schematic diagram of the second stage of the shifter circuit.

Referring now to FIG. 5, a schematic diagram is shown of a circuit which has been employed for the second stage 122 of the shifter 102. As illustrated, the shifter second stage 122 may be essentially the same as the first stage 120, except that the first stage has an additional switching device QN7 for the N_Go signal.

At time T1 the input signals Hi and Low are low. With a logic low state for the Low signal on the input connected to the gates of QP10, QN11, QN12, QN16 and to the input of inverter Inv 2, QP10 is on, QN11, QN12 and QN16 are off, and the output signal Pre_P_Low of Inv 2 is high. With a logic low state for the Hi signal on the input connected to the gate of QP11, this turns QP11 on. With QP11 on and QN11, QN12 and QN16 off, the output signal Pre_P_Hi is high.

QN13 and QN14 are generally held on, as long as their source voltages are more than a threshold voltage below Vdd, since their gates are connected to Vdd. But, with Q11 on, the source voltage for QN13 and QN14 (tied to the same node as the Pre_P_Hi signal) is driven above Vdd, so QN14 and QN14 are turned off at time T1.

Figure 6:
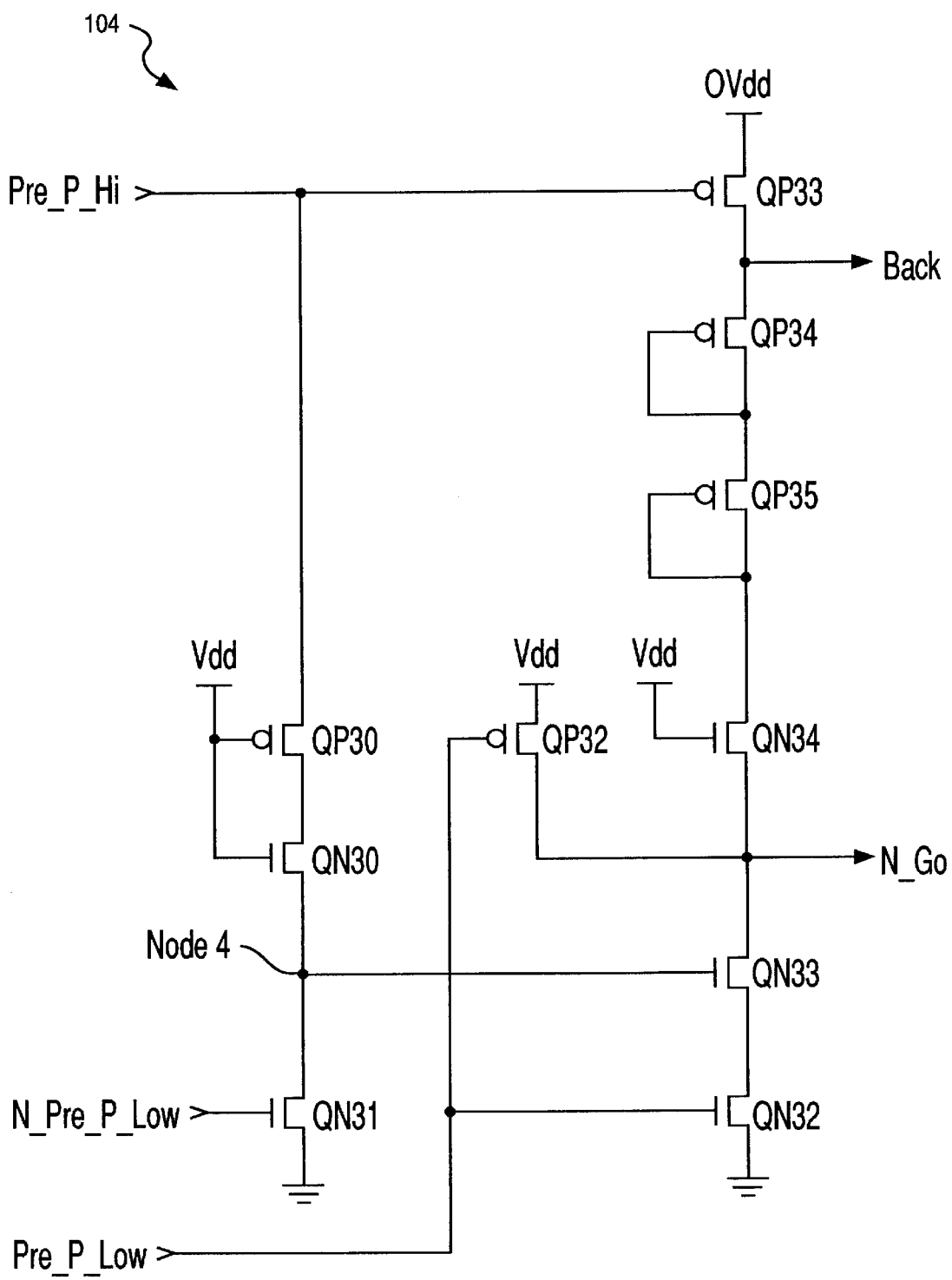
FIG. 6 is a schematic diagram of the feedback circuit for the device.

Referring now to FIG. 6, a schematic diagram is shown of a circuit which has been employed for the feedback stage 106. As indicated previously, it is considered that at time T1 the feedback stage 106 has not responded to Pre_P_Hi and Pre_P_Low going high, so at time T1 Pre_P_Hi and Pre_P_Low are low. With a logic low state for the Pre_P_Low signal on the input connected to the gates of QP32, and QN32, this turns QP32 on and QN32 off. With a logic low state for the Pre_P_Hi signal on the input connected to the gate of QP33, this turns QP33 off. With a logic high state for the N_Pre_P_Low signal on the input connected to the gate of QN31, this turns QN31 on. QN30 and QN34 are constantly held on, as long as their source voltage remains at least a threshold voltage level below Vdd, since their gates are connected to Vdd. QP30 is constantly held on, as long as its source voltage remains at least a threshold voltage level above Vdd, since its gate is to Vdd. QP34 and QP35 act as diodes with their gates tied to their drains. Thus, with QP33 on and QN32 off, the Back output signal is high. And, with QP32 on and QN32 off, the N_Go output signal is high.

The feedback circuit 104 responds to the change in its inputs so that at time T2, considering the Pre_P_Hi and Pre_P_Low input signals high and the N_Pre_P_Low input signal low, QN31, QN32 and QP33 turn off and QN32 turns on. The combination of QP30 and QN30 act as a voltage level sensor connected to the gate of QN33 so that the Pre_P_Hi input signal being high at a voltage level more than a threshold voltage above Vdd tends to pull Node 4 up through QP30 and QN30, tending to turn on QN33. With QP32 and QP33 off, and, with QN33 tending to turn on and QN32 fully on, this tends to pull the N_Go signal low through QN33 and QN32. Likewise, it tends to pull the Back signal low through QN32, QN33, Qn34, QP35 and QP34.

Referring again to the shifter 102 first stage 120 schematic of FIG. 4, when the Back and N_Go signals go low at time T2, the Back signal turns on QP2 and the N_Go signal turns off QN7. QP2 on tends to pulls up the Hi signal and QN7 off allows the HI signal to rise unopposed, so the High signal rises to a logic high state approaching voltage OVdd. This also pulls up Nodes E and F until QN3 and QN6 turn off due to QN3 and QN6 source voltage (i.e., Node E and Node F respectively) approaching Vdd. However, the Low signal remains low since the In signal inputted to the inverter Inv 1 is still low. In this state, QN4 is precharged, in that its gate and drain voltages with respect to ground tend to drive QN4 on, so that when the QN4 source is switched to ground through QN5, charging of the gate of QN4 during switching is substantially reduced and QN4 turns on quickly.

Referring again to the shifter 102 second stage 122 schematic of FIG. 5, when the Hi signal goes high after time T2, this turns off QP11. The Low signal is still low, so that QP10 is still on, QN11, QN12 and QN16 are still off, and the output signal Pre_P_Low of Inv 2 is still high. With QP11, QN11, QN12 and QN16 off, QP12 provides a charging current for any leakage current in QN16 and QN16 to hold the output signal Pre_P_Hi high. Thus, in this state Pre_P_Hi remains high despite the Hi signal going high.

Summarizing, the description of the cycle up to this point illustrates how, in response to the In signal going low, the feedback circuit 104 drives the shifter circuit 102 first stage 120 Hi signal to a high state, without causing the second stage 122 output signals Pre_P_Hi and Pre_F_Low to change states, and preconditions the second stage 122.

Referring again to the first stage 120 of shifter 102 shown in FIG. 4, at time T3, when the In signal has gone low, QP1 turns on, pulling Node E up to further approach. Vdd, thereby further precharging QN4. Also, QN5 turns off, and inverter Inv1 drives the Low signal to a high state approaching Vdd.

Referring again to the second stage 122 of shifter 102 shown in FIG. 5, when the Low signal goes high at time T3 this drives the output of Inv 2, Pre_P_Low, low. It also turns off QP10, and turns on QN11, QN12 and QN16. With QN11 and QN12 on this pulls down Node E2 tending to turn on QN13 and turn off QN15. This tends to pull down the Pre_P_Hi signal through QN11, QN12 and QN13 until QN15 turns off so that Pre_P_Hi falls to a logic low state approaching Vlim.

According to the embodiment, NFET's QN14, QN15 and QN16 are relatively large devices so that they have the capability to pull down the Pre_P_Hi signal relatively quickly. Furthermore, since QP11 has been turned off by the Hi signal, and therefore does not oppose the NFET's, the Pre_P_Hi signal can be pulled down by these NFET's all the more quickly.

Referring again to the feedback circuit 104 shown in FIG. 6, when the Pre_P_Low and Pre_P_Hi signals go low after time T3 this turns on QP32, QP33 and QN31 and turns off QN32 and QN33. So at time T4, with QP33 on and QN32 and QN33 off this pulls up Back to a high state approaching OVdd, and with QP32 on and QN32 and QN33 off this pulls up N_GO to a high state approaching Vdd.

Referring again to the first stage 120 of the shifter 102 shown in FIG. 4, when the Back and N_GO signals go high at time T4 this turns off QP2 and turns on QN7. Since the In signal is still low the output of inverter Inv 1 remains high. Also, QN5 remains off, so that the N_Go signal turning on QN7 does not affect the Hi signal. Nor does the Back signal turning off QP2 affect the Hi signal, since with QN1, QN2 and QN7 off, QP4 provides a charging current for any QN4, QN5 and QN7 leakage current to hold the Hi signal in the high state approaching OVdd.

Thus, the Back signal going high at time T4 preconditions the shifter first stage 120 but without causing the Hi and Low signals to change so that the second stage 122 is not affected. During the preconditioning, QP2 turns off and then, when the In signal goes high at the beginning of the next cycle, the Hi signal is pulled low through NFET's QN4, QN5, QN6, and QN7 faster than would be the case if QP2 opposed the NFET's or had to be switched at the same time as the NFET's. QP4 is of a small size to merely provide charging current to hold up the Hi signal when QN1 and QN2 are off, and is too small to significantly affect QN1, QN2 and QN3 pulling down the Hi signal when QN1 and QN2 are turned on. Furthermore, because the preconditioning pulls the Hi signal low quicker, QP11 in the second stage 122 (FIG. 5) is switched on faster so that the second stage 122 output Pre_P_Hi signal is pulled up faster.

It should be appreciated from the above description that charging of switching devices, such as QN4, at low currents during preconditioning substantially reduces required peak switching current requirement as compared to charging that would be needed to switch the switching devices at higher speeds. Also, a very substantial power reduction is realized in reducing crossover current by preconditioning tending to turn off PFET's QP2 and QP11 before turning on NFET's to pull down output signals Hi and Pre_P_Hi.

Although the present invention and its advantages have been described in detail, it should be understood that various changes, substitutions and alterations can be made without departing from the spirit and scope of the invention as defined by the following claims.

What is claimed is:

1. An apparatus for shifting the level of a signal, comprising:
    a shifter receiving a multi-logic state input signal and generating a multi-logic state output signal responsive to changes in logic state of the input signal and whose voltage level is shifted with respect to the input signal; and
    a feedback circuit feeding a signal derived from the output signal back to the shifter to precondition the shifter so that the speed of the output signal transition between states is accelerated;
    wherein:
        i) the shifter has at least one switching device and the preconditioning drives the at least one switching device to a physical state that is advantageous for a succeeding logic state of the shifter output signal so that when the input signal changes to the succeeding logic state the switching device has already been driven to the advantageous physical state,
        ii) the at least one switching device has physical on and off states, and the preconditioning drives the at least one switching device toward the off state so that when the output signal transitions to a certain logic state the switching device does not substantially oppose the transition,
        iii) the shifter has a first voltage supply compatible with voltage requirements of a circuit which generates the input signal to the shifter, and a second voltage supply at a higher voltage level compatible to voltage requirements for a circuit driven by the shifter,
        iv) certain switching devices in the shifter are supplied by the first voltage supply and certain switching devices in the shifter are supplied by the second voltage supply, and
        v) driving the at least one switching device toward the off state includes driving a switching device supplied by the second voltage supply.

2. A method for shifting the level of a signal, comprising:
    providing the shifter a first voltage supply compatible with voltage requirements of a circuit which generates the input signal to the shifter, and a second voltage supply at a higher voltage level compatible to voltage requirements for a circuit driven by the shifter;
    supplying certain switching devices in the shifter by the first voltage supply at a lower voltage and certain switching devices in the shifter by the second voltage supply at a higher voltage;
    receiving a multi-logic state input signal in a shifter;
    generating a multi-logic state output signal in the shifter responsive to switches in logic state of the input signal and shifted in voltage level with respect to the input signal;
    feeding a feedback signal derived from the output signal back to the shifter; and
    preconditioning the shifter in response to the feedback signal so that the speed of the output signal switching is accelerated, wherein the preconditioning comprises:
        driving at least one switching device in the shifter to a physical state that is advantageous for a succeeding logic state of the shifter output signal so that when the input signal changes to the succeeding logic state the switching device has already been driven to the advantageous physical state, and
        driving the at least one switching device supplied by the second voltage supply toward an off state so that when the output signal transitions to a certain logic state the switching device does not substantially oppose the transition.

3. An apparatus for shifting a voltage level of an input signal, comprising:
    circuitry having a first-stage, for receiving an input signal, coupled to a second-stage for generating an output signal at a higher voltage level than the input signal;
    feedback circuitry for generating, as a feedback signal to the first-stage, an inverted high voltage output signal from the second-stage;
    wherein, in the first-stage, when a first-stage high voltage output is at a low voltage level in response to the input and feedback signals being high, the first-stage high voltage output signal i) goes to a high voltage level in response to the feedback signal going to a low voltage level, ii) holds the high voltage level when the input signal then goes to a low voltage level, iii) continues to hold the high voltage level when the feedback signal then goes to a high voltage level, and iv) then goes to a low voltage level in response to the input signal then going to a high voltage level, so that when the input signal goes from the high to the low voltage level, the first-stage high voltage output signal has already gone to the high voltage level, and, by having already gone to the high voltage level, has precharged a switching device in the second-stage, which otherwise would oppose the second-stage high voltage output signal going to the low voltage level.

4. A method, in circuitry having a first-stage, for receiving an input signal, coupled to a second-stage for generating an output signal at a higher voltage level than the input signal, comprising the steps of:

a) generating, as a feedback signal to the first-stage, a signal inverted from the high voltage output signal of the second-stage;

b) switching a first-stage high voltage output signal to a high voltage level in response to the feedback signal going to a low voltage level, wherein the first-stage high voltage output was, prior to the switching, at a low voltage level in response to the input and feedback signals being high;

c) maintaining the first-stage high voltage output signal at the high voltage level, to which it switched in step b), despite the input signal going to a low voltage level following the feedback signal switching to the low voltage level in step b);

d) maintaining the first-stage high voltage output signal at the high voltage level, to which it switched in step a), despite the feedback signal going to a high voltage level in response to the input signal going to the low voltage level in step c);

e) switching the first-stage high voltage output signal to a low voltage level in response to the input signal going to a high voltage level after step d), so that when the input signal goes from the high to the low voltage level in step c), the first-stage high voltage output signal has already gone to the high voltage level in step b) and, by having already gone to the high voltage level in step b), has precharged a switching device in the second-stage, which otherwise would oppose the second-stage high voltage output signal going to the low voltage level in step c).

* * * * *